United States Patent [19]
Shih

[11] Patent Number: 5,930,277
[45] Date of Patent: Jul. 27, 1999

[54] POWER SAVING DEVICE FOR VISIBLE LASER DIODE APPARATUS

[75] Inventor: Yu-Ming Shih, Hsinchu, Taiwan

[73] Assignee: Tony Investment Co., Ltd., Taiwan

[21] Appl. No.: 08/757,090

[22] Filed: Nov. 26, 1996

[51] Int. Cl.$^6$ ...................................................... H01S 3/00
[52] U.S. Cl. .................................................................. 372/38
[58] Field of Search ............................ 372/25, 26, 28, 372/38

[56] References Cited

U.S. PATENT DOCUMENTS

| | | | |
|---|---|---|---|
| 4,924,470 | 5/1990 | Ries | 372/32 |
| 5,012,113 | 4/1991 | Valentine et al. | 372/38 |
| 5,408,485 | 4/1995 | Ries | 372/29 |
| 5,444,728 | 8/1995 | Thompson | 372/38 |
| 5,539,761 | 7/1996 | Golub et al. | 372/38 |

*Primary Examiner*—Rodney Bovernick
*Assistant Examiner*—Robert E. Wise
*Attorney, Agent, or Firm*—Finnegan, Henderson, Farabow, Garrett & Dunner, L.L.P.

[57] ABSTRACT

The invention relates to a power saving device for a visible laser diode apparatus. The invention is designed in accordance with the principle of visual persistence and the specific photo-electrical characteristics of a laser diode. In accordance with the power saving device of the invention, it can save the power consumption of a visible laser diode apparatus, enhance the heat dissipating efficiency and prolong the lifetime of a laser diode.

7 Claims, 1 Drawing Sheet

POWER SAVING DEVICE FOR VISIBLE LASER DIODE APPARATUS

REFERENCE TO PRIOR APPLICATION

This application has been filed in the R.O.C. (Taiwan) as Patent Application No. 85213055 on Aug. 26, 1996.

FIELD OF THE INVENTION

The invention relates to a power saving device for a visible laser diode apparatus, and more particularly, to a power saving device designed in accordance with the principle of visual persistence and the specific photo-electrical characteristics of a laser diode.

BACKGROUND OF THE INVENTION

Laser diodes are widely used in projecting and alignment apparatus, such as laser pointers, aligners and leveling equipment. However, the designs of the conventional visible laser diode apparatus have many disadvantages, such as poor thermal dissipation, that present the laser diode from achieving the desired effect in the practical applications.

FIG. 1 illustrates the Light Output Power-Current characteristic of a laser diode. A laser diode will emit laser beam after the operation current exceeds its threshold current $I_{th}$. Therefore, only the current above $I_{th}$ will effect the laser beam, that is, the light output power of a laser diode is proportional to $(I_{op}-I_{th})$, where $I_{op}$ is the operation current of the laser diode. However, the power consumption is proportional to $I_{op}$. Accordingly, as far as the laser beam is concerned, the current under $I_{th}$ is wasted. In addition, the current below $I_{th}$ will cause a laser diode to generate heat and thus shorten the lifetime of a laser diode. Furthermore, the operation current is continuously supplied to the laser diode after the laser beam is emitted, thus the laser diode continuously emits laser beam and generates heat. However, the current below $I_{th}$ does not effect the emission of laser beam but causes the laser diode to generate heat. Therefore, the power consumption of the visible laser diode apparatus is very much and thus the power source (battery) must be replaced frequently. In addition, the lifetime of the laser diode is shortened.

SUMMARY OF THE INVENTION

In view of the disadvantages of the conventional laser diode apparatus, it is an object of the present invention to provide a power saving device for a visible laser diode apparatus which utilizes the principle of visual persistence and the specific photo-electrical characteristics of a laser diode. The present invention intermittently supplies operation current to the visible laser diode apparatus to actuate laser beam on the condition that human eyes can not distinguish that the laser beam is intermittent, thereby saving power consumption.

It is another object of the present invention to provide a power saving device for a visible laser diode apparatus to reduce heat generation so as to prolong the lifetime of the laser diode.

It is a further object of the present invention to utilize the principle of visual persistence to achieve the power saving purpose and prolong the lifetime of the laser diode.

It is a further object of the present invention to utilize the specific photo-electrical characteristics of a laser diode to achieve the power saving purpose and prolong the lifetime of the laser diode.

BRIEF DESCRIPTION OF THE DRAWINGS

For a more complete understanding of the present invention and the advantages thereof, reference is now made to the following descriptions taken in conjunction with the accompanying drawings which illustrate one or more embodiments of the present invention.

DETAILED DESCRIPTION OF THE INVENTION

Figure 1:
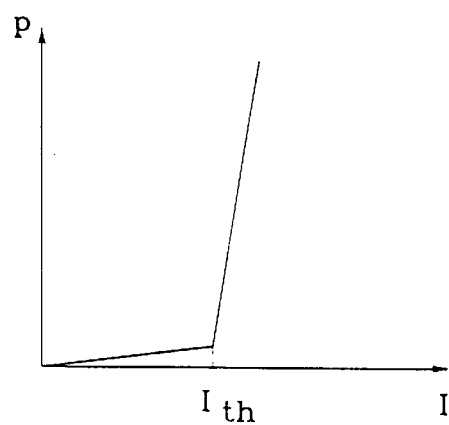
FIG. 1 illustrates the Light Output Power-Current characteristic of a laser diode.
Figure 2:
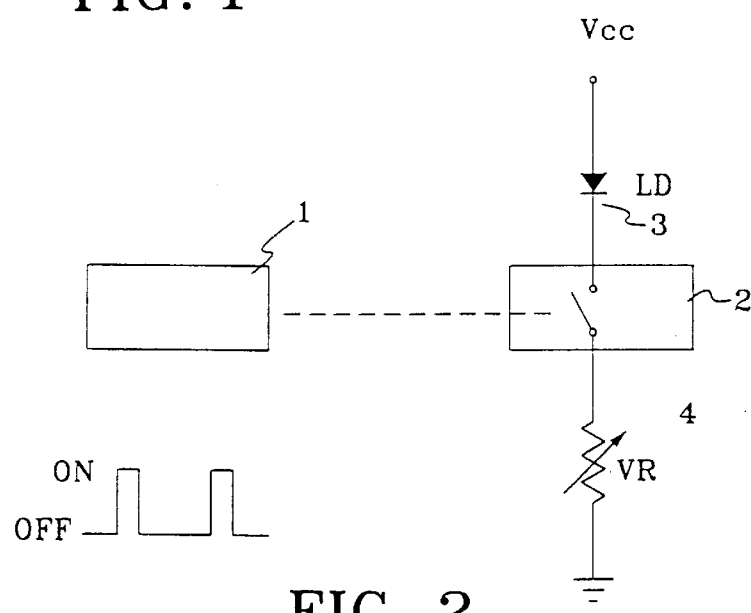
FIG. 2 illustrates a schematic diagram of the power saving device in accordance with an embodiment of the present invention.

Referring to FIG. 2, it illustrates a schematic diagram of an embodiment of the present invention. The anode of a laser diode (3) is connected to power source (battery) Vcc, the cathode is connected to an electronic switch (2). The electronic switch (2) is in series with a variable resistor (4), and the other end of the variable resistor (4) is connected to ground. An electronic oscillator (1) generates periodic ON-OFF clock signals which are used to control the emission of laser beam.

When the switch (not shown) of the visible laser diode apparatus is turned on, the electronic oscillator (1) will generate periodic ON-OFF clock signals with a predetermined frequency and transmit them to the electronic switch (2). The electronic switch (2) intermittently actuates the laser diode (3) to emit laser beam in response to the periodic ON-OFF clock signals. The operation current of the laser diode (3) is adjusted by the variable resistor (4) so that the operation current can instantly actuate the laser diode (3).

The invention will now be described in greater detail. In accordance with the principle of visual persistence, human eyes can not distinguish light changes when the light is changed at a frequency above 16 Hz. The present invention utilizes the principle of visual persistence and the specific photo-electrical characteristics of a laser diode to save power consumption. In addition, in order to obtain the same visual sensation of the conventional laser beam, the clock signal frequency generated by the electronic oscillator (1) of the present invention is optimum in the range of 10–30 Hz.

Figure 3:
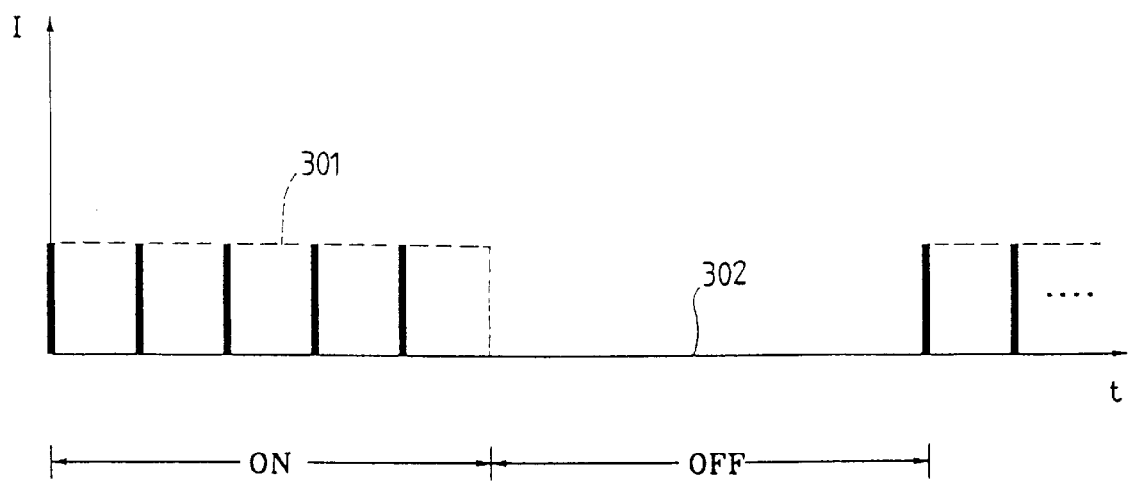
FIG. 3 illustrates the clock pulses generated by the electronic oscillator in accordance with an embodiment of the present invention.

Referring to FIG. 3, the clock signal generated by the electronic oscillator (1) comprises a first section (301) and a second section (302), wherein the duration of the first and second sections are each $\frac{1}{32}$ second each. During the second section (302), the electronic oscillator (1) does not generate any pulse, and thus the laser diode (3) is not actuated. The first section is further divided into five subsections, and the duration of each subsection is $\frac{1}{160}$ second. During the first section (301), the electronic oscillator (1) generates a pulse signal to the electronic switch (2) for each subsection, wherein the duration of the pulse signal (or the pulse width) is $\frac{1}{10}$ of the subsection (i.e. $\frac{1}{1600}$ second, as shown in bolded vertical lines in FIG. 3). The electronic switch (2) then intermittently actuates the laser diode (3) to emit a laser beam in response to the pulse signals. Because the response time of a laser diode is about 1 ns, if the operation current of a laser diode is large enough, the $\frac{1}{1600}$ second is quick enough to actuate the laser diode instantly.

In a clock signal cycle ($\frac{1}{16}$ second), the electronic oscillator (1) only generates five pulses (each with $\frac{1}{1600}$ second in duration) to the electronic switch (2) for actuating the laser diode to emit laser beam. Therefore, the power consumption is very economical. In addition, the emission time of the laser diode is very short, and thus the heat dissipation is very quick and the lifetime of the laser diode is prolonged.

The power saving effect will now be described in greater detail. Suppose one laser diode has characteristics of $I_{th}$=30 mA, $S_d$=0.5 mW/mA ($S_d$ represents the light emitting efficiency after the laser beam is emitted) and the power source is supplied by batteries (1.5V×2). In addition, the operation current of the laser diode in the present invention is 50 mA ($I_{op}$=50 mA). Therefore, during each subscription duration (1/160 second), the light output power is (50 mA−30 mA)×0.5 mW/mA=10 mW However, the emission time of the laser beam is merely 1/10 of the subsection duration, i.e., 1/1600 second, and thus the mean light output power is only 1 mW. In a clock signal cycle (1/1600 second), and power consumption $W_1$ is $W_1$=V×I×t=3×0.05×1/1600×5=0.00047 (Joule)

In a conventional visible laser diode apparatus, the power source is continuously supplied to the laser diode. If the operation current is 32 mA, the light output is (32 mA−30 mA)×0.5 mW/mA=1 mW The power consumption $W_2$ is $W_2$=V×I×t=3×0.0032×1/16=0.006 (Joule)

In accordance with our experimental result, human eyes can not distinguish the change of light during the visual persistence period from a continuous light if the light output power of the two are the same.

In conclusion, under the same output power (1 mW), the power consumption of the present invention is only 8% of that of conventional laser diode apparatus. Therefore, the lifetime of battery can be prolonged at least 10 times.

In another embodiment, during the second section, we also supply five pulses as those of the first section to control the laser diode. In this embodiment, it does not utilize the principle of visual persistence. Although the power of consumption will be two times of the above-mentioned embodiment, its power consumption is only 16% of that of a conventional one. Therefore, the invention can save power consumption by simply using the photo-electrical characteristics of a laser diode.

In a further embodiment, we supply a voltage source to the laser diode during the first section as a conventional one and do not supply a voltage source during the second section. The power consumption is thus one-half of that of a conventional one. Therefore, the present invention can save power consumption by simply using the principle of visual persistence.

As described above, the present invention overcomes the disadvantages of the prior art and reduces power consumption. In addition, the present invention increases the heat dissipating efficiency and prolongs the lifetime of the laser diode. Furthermore, the power saving device for a visible laser diode apparatus of the invention can be applied to visible laser pointers, leveling equipment and aligners.

Therefore, the invention has the features of novelty, inventive step and industrial applicability.

Although the present invention and its advantage have been described in detail, it should be understood that various changes, substitutions and alternations can be made herein without departing from the spirit and scope of the invention as defined by the appended claims.

What is claimed is:

1. A power saving device for a visible laser diode apparatus, comprising:

an electronic oscillator for generating periodic ON-OFF clock signals; and a bipolar electronic switch connected to a power source for turning on and off said power source in response to said periodic ON-OFF clock signals thereby actuating-deactuating said laser diode;

wherein said periodic ON-OFF clock signals have a frequency of at least 10 Hz.

2. The power saving device according to claim 1, further comprising a variable resistor for adjusting the operation current of said laser diode.

3. A power saving device for a visible laser diode apparatus, comprising:

an electronic oscillator for generating periodic clock signals, wherein each periodic clock signal comprises a first section having a plurality of pulse signals and a second section having no pulse signal; and an electronic switch for actuating-deactuating said laser diode in response to said periodic clock signals, wherein said periodic clock signals have a frequency of at least 10 Hz, and wherein the operation current of said laser diode is greater than the threshold current of said laser diode and the duration of said pulse signal in said first section is less than the duration of said periodic clock signal.

4. The power saving device according to claim 3, wherein the frequency of said pulse signal in said first section is larger than 30 Hz.

5. The power saving device according to claim 3, further comprising a variable resistor for adjusting the operation current of said laser diode.

6. A power saving device for a visible laser diode apparatus, comprising:

an electronic oscillator for generating periodic ON-OFF clock signals; and a unipolar electronic switch connected to a power source for turning on and off said power source in response to said periodic ON-OFF clock signals thereby actuating-deactuating said laser diode;

wherein said periodic ON-OFF clock signals have a frequency of at least 10 Hz.

7. The power saving device according to claim 6, further comprising a variable resistor for adjusting the operation current of said laser diode.

* * * * *